(12) United States Patent
Tu et al.

(10) Patent No.: US 11,538,756 B2
(45) Date of Patent: Dec. 27, 2022

(54) BONDING STRUCTURE AND METHOD FOR MANUFACTURING THE SAME

(71) Applicant: Advanced Semiconductor Engineering, Inc., Kaohsiung (TW)

(72) Inventors: Shun-Tsat Tu, Kaohsiung (TW); Pei-Jen Lo, Kaohsiung (TW); Chien-Han Chiu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/023,260

(22) Filed: Sep. 16, 2020

(65) Prior Publication Data

US 2022/0084951 A1    Mar. 17, 2022

(51) Int. Cl.
*H01L 23/532* (2006.01)
*H01L 21/768* (2006.01)
*H01L 23/00* (2006.01)
*H01L 23/495* (2006.01)

(52) U.S. Cl.
CPC .. *H01L 23/53238* (2013.01); *H01L 21/76841* (2013.01); *H01L 23/49513* (2013.01); *H01L 24/05* (2013.01)

(58) Field of Classification Search
CPC ............... H01L 23/53238; H01L 24/05; H01L 21/76841; H01L 23/49513
See application file for complete search history.

(56) References Cited

U.S. PATENT DOCUMENTS

| | | | |
|---|---|---|---|
| 2014/0217593 A1* | 8/2014 | Chen ............... | B23K 1/0016 257/762 |
| 2021/0333309 A1* | 10/2021 | Tien ................ | G01R 3/00 |
| 2022/0018036 A1* | 1/2022 | Banik, II .......... | H01L 24/11 |

FOREIGN PATENT DOCUMENTS

| | | | |
|---|---|---|---|
| CN | 106298634 A | 1/2017 | |
| WO | WO-2020092244 A1 * | 5/2020 | ............ C25D 7/12 |

OTHER PUBLICATIONS

Liu et al., Effect of grain orientations of Cu Seed layers on the growth of <111> orietented nanotwinned Cu (Year: 2014).*
Lu et al., Extremely anisotropic single-crystal growth in nanotwinned copper. (Year: 2014).*

* cited by examiner

*Primary Examiner* — Douglas W Owens
(74) *Attorney, Agent, or Firm* — Foley & Lardner LLP

(57) ABSTRACT

A bonding structure is provided. The bonding structure includes a conductive layer, a seed layer, and a nanotwinned copper (NT-Cu) layer. The seed layer is disposed on the conductive layer. The NT-Cu layer is disposed on the seed layer. The NT-Cu layer has anisotropic crystal structure.

16 Claims, 23 Drawing Sheets

US 11,538,756 B2

BONDING STRUCTURE AND METHOD FOR MANUFACTURING THE SAME

BACKGROUND

1. Field of the Disclosure

The present disclosure relates to a bonding structure. Specifically, the present disclosure relates to a bonding structure including a nanotwinned copper (NT-Cu) layer.

2. Description of the Related Art

During chip integration, some elements are sensitive to temperature, so the bonding temperature should be lowered, for example, to a temperature of less than 250° C. The temperature of a hybrid bond process may be in the range of about 300° C. to 400° C. Copper (Cu) with (111)-orientation has a lower bonding temperature and lower resistivity. However, it is difficult to well-develop a (111)-orientation bonding surface in a copper damascene process. Better structure is needed so that Cu with (111)-orientation can be effectively applied to chip integration.

SUMMARY

In some embodiments, the bonding structure includes a conductive layer, a seed layer, and a nanotwinned copper (NT-Cu) layer. The seed layer is disposed on the conductive layer. The NT-Cu layer is disposed on the seed layer. The NT-Cu layer has an anisotropic crystal structure.

In some embodiments, the bonding structure includes a seed layer, an anisotropic NT-Cu layer, a dielectric layer and a barrier layer. The anisotropic NT-Cu layer is disposed on the seed layer. The dielectric layer surrounds the anisotropic NT-Cu layer. The barrier layer is disposed between the dielectric layer and the anisotropic NT-Cu layer.

In some embodiments, the method for manufacturing a bonding structure includes providing a seed layer; forming a NT-Cu layer on the seed layer; and forming a barrier layer surrounding the NT-Cu layer.

BRIEF DESCRIPTION OF THE DRAWINGS

Aspects of some embodiments of the present disclosure are readily understood from the following detailed description when read in conjunction with the accompanying figures. It is noted that various structures may not be drawn to scale, and dimensions of the various structures may be arbitrarily increased or reduced for clarity of discussion.

DETAILED DESCRIPTION

Figure 1A:
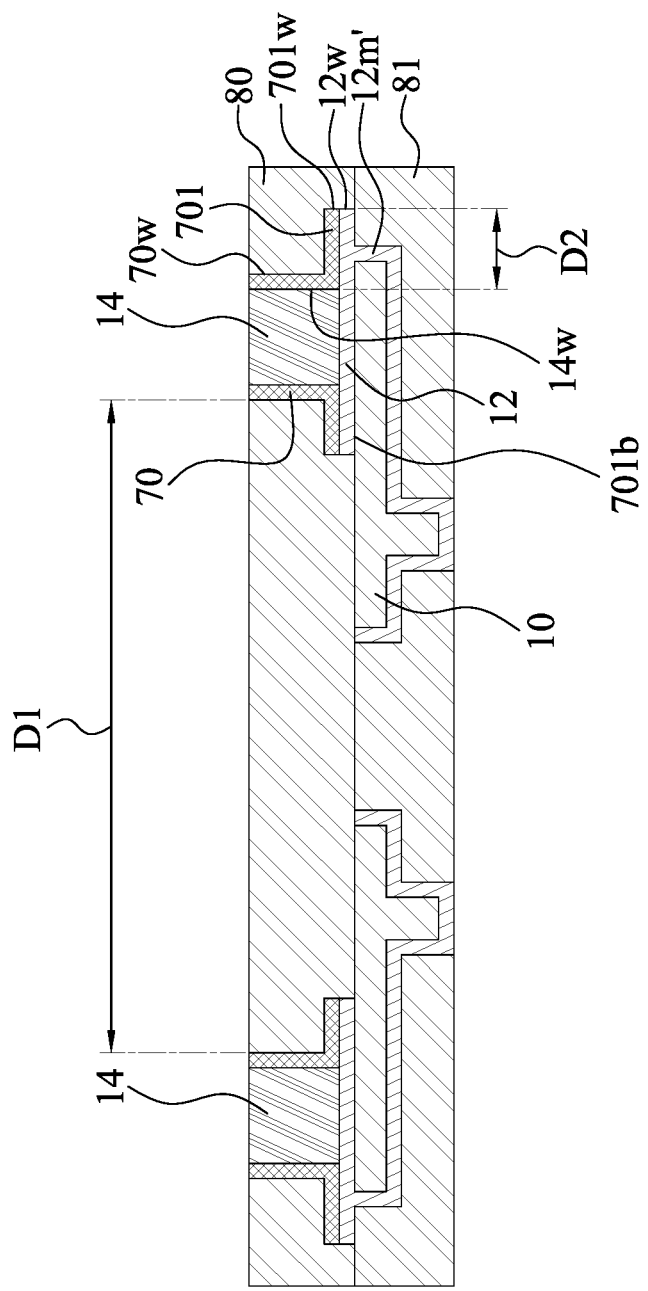
FIG. 1A illustrates a cross-sectional view of a bonding structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure provides a new bonding structure. The bonding structure includes a nanotwinned copper (NT-Cu) layer having anisotropic crystal structure. Therefore, it is applicable to low temperature bonding process and can be realized, and superior bonding strength and electrical connection can be achieved by using the bonding structure according to the present disclosure.

FIG. 1A illustrates a cross-sectional view of a bonding structure 1A according to some embodiments of the present disclosure. The bonding structure 1A includes a conductive layer 10, a seed layer 12, a nanotwinned copper (NT-Cu) layer 14, a barrier layer 70 and a dielectric layer 80. In some embodiments, the conductive layer 10 may include, for example, gold (Au), silver (Ag), copper (Cu), platinum (Pt), palladium (Pd), other metal(s) or alloy(s), or other suitable conductive material.

The conductive layer 10 may be embedded in a dielectric layer 81 and exposed from a top surface of the dielectric layer 81. In some embodiments, the conductive layer 10 may include pad(s), trace(s) or via(s) although they are not explicitly shown or denoted in the drawings. In some embodiments, a seed layer 12m' may be formed on the top surface of the dielectric layer 81 and/or in openings of the dielectric layer 81 so as to facilitate the formation of the conductive layer 10; the seed layer 12m' may be viewed as a part of the conductive layer 10).

The seed layer 12 is disposed on the conductive layer 10 (e.g., on a pad of the conductive layer 10). In some embodiments, the seed layer 12 is a patterned structure. In some embodiments, the seed layer 12 may include, for example, copper (Cu), or titanium (Ti) or other metal, or a metal alloy, or other conductive material.

The NT-Cu layer 14 is disposed on the seed layer 12. The NT-Cu layer 14 is (111)-oriented. In some embodiments, the NT-Cu layer 14 has an anisotropic crystal structure. In some embodiments, a lateral width of the NT-Cu layer 14 is less than a lateral width of the seed layer 12. In the present disclosure, the term "lateral width" refers to a size of the layer in the horizontal direction. In some embodiments, the NT-Cu layer 14 has a top surface exposed from the barrier layer 70. In some embodiments, the NT-Cu layer 14 has a top surface exposed from a dielectric layer 80. In some embodiments, the top surface of the NT-Cu layer 14 is highly (111)-oriented. In some embodiments, the NT-Cu layer 14 is in the form of a pillar, a bump or a via.

The barrier layer 70 is disposed between the dielectric layer 80 and the NT-Cu layer 14. In some embodiments, the barrier layer 70 surrounds the NT-Cu layer 14. In some embodiments, the barrier layer 70 directly contacts the NT-Cu layer 14. The barrier layer 70 has an outer sidewall 70w. In some comparative embodiments where the barrier layer is absent, copper (Cu) from the NT-Cu layer may diffuse into the dielectric layer to a distance up to 6.0 micrometers (μm) and result in component failure. Unlike comparative embodiments, the barrier layer 70 of the present disclosure can alleviate Cu diffusion from the NT-Cu layer 14 to the dielectric layer 80 and thus a superior reliability can be achieved. In addition, since Cu diffusion issue is improved by the barrier layer 70, a pitch of two adjacent NT-Cu layers can be reduced as compared to the comparative embodiments. Referring to FIG. 1A, the pitch of two adjacent NT-Cu layers may be evaluated based on a distance D1 between the outer sidewalls 70w of the barrier layers 70 which surround the two adjacent NT-Cu layers 14 respectively. In some embodiments, the distance D1 may be 6.0 μm or below, 5.5 μm or below, or 5.0 μm or below. In some embodiments, the distance D1 may be in the range of 4.5 μm to 5.5 μm.

In some embodiments, the barrier layer 70 includes an extension portion 701 protruding from an outer sidewall 70w of the barrier layer 70. In some embodiments, an extension portion 701 of the barrier layer 70 has a sidewall 701w substantially coplanar with a sidewall 12w of the seed layer 12. The extension portion 701 of the barrier layer 70 has a bottom surface 701b in contact with the seed layer 12. In some embodiments, the barrier layer 70 includes an extension portion 701 in contact with the seed layer 12 and has an L-shape. In the embodiments where the barrier 70 includes an extension portion 701, the barrier layer 70 may function as an anchor and thus the adhesion between the NT-Cu layer 14 and the dielectric layer 80 can be further enhanced by the barrier layer 70. In some embodiments, a smallest distance D2 from a sidewall 14w of the NT-Cu layer 14 to the outer sidewall 701w of the extension portion 701 of the barrier layer 70 may be 0.05 μm or more. In some embodiments, D2 may be in a range of 0.05 μm to 1 μm.

The barrier layer 70 may be made of metal, alloy, metal nitrides, metal silicon nitrides, or other suitable material. In some embodiments, the barrier layer 70 may include titanium (Ti), tantalum (Ta), tungsten (W), nickel (Ni), titanium nitride (TiN), tantalum nitride (TaN), tungsten nitride (WN), titanium silicon nitrides (TiSiN), tantalum silicon nitrides (TaSiN), or tungsten silicon nitrides (WSiN).

In the embodiments illustrated in FIG. 1A, the barrier layer 70 is disposed on the seed layer 12 and surrounds the NT-Cu layer 14. In some other embodiments, for example, those illustrated in FIG. 1B (discussed below), the barrier layer 70 is disposed on the conductive layer 10 and surrounds the NT-Cu layer 14 and the seed layer 12.

The dielectric layer 80 surrounds the NT-Cu layer 14. In some embodiments, the dielectric layer 80 may be made of oxides (e.g., $SiO_x$), nitrides ($SiN_x$), polymeric materials or other suitable material.

Figure 1B:
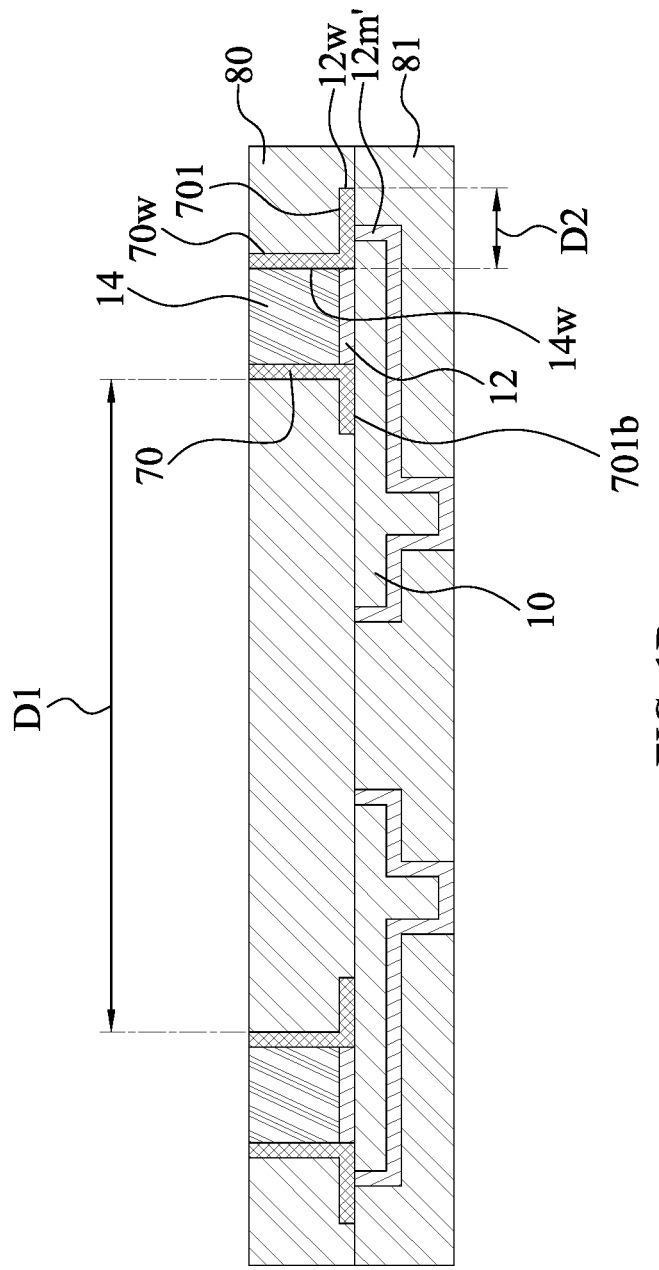
FIG. 1B illustrates a cross-sectional view of a bonding structure according to some embodiments of the present disclosure.

FIG. 1B illustrates a cross-sectional view of a bonding structure 1B according to some embodiments of the present disclosure. The bonding structure 1B is similar to the bonding structure 1A of FIG. 1A, except that in the embodiments illustrated in FIG. 1B, the barrier layer 70 is disposed on the conductive layer 10 and surrounds the NT-Cu layer 14 and the seed layer 12. The barrier layer 70 may directly contact the NT-Cu layer 14 and the seed layer 12. The barrier layer 70 includes an extension portion 701 protruding from an outer sidewall 70w of the barrier layer 70. The extension portion 701 of the barrier layer 70 has a bottom surface 701b in contact with the conductive layer 10. A lateral width of the NT-Cu layer 14 is substantially the same as a lateral width of the seed layer 12.

Figure 2:
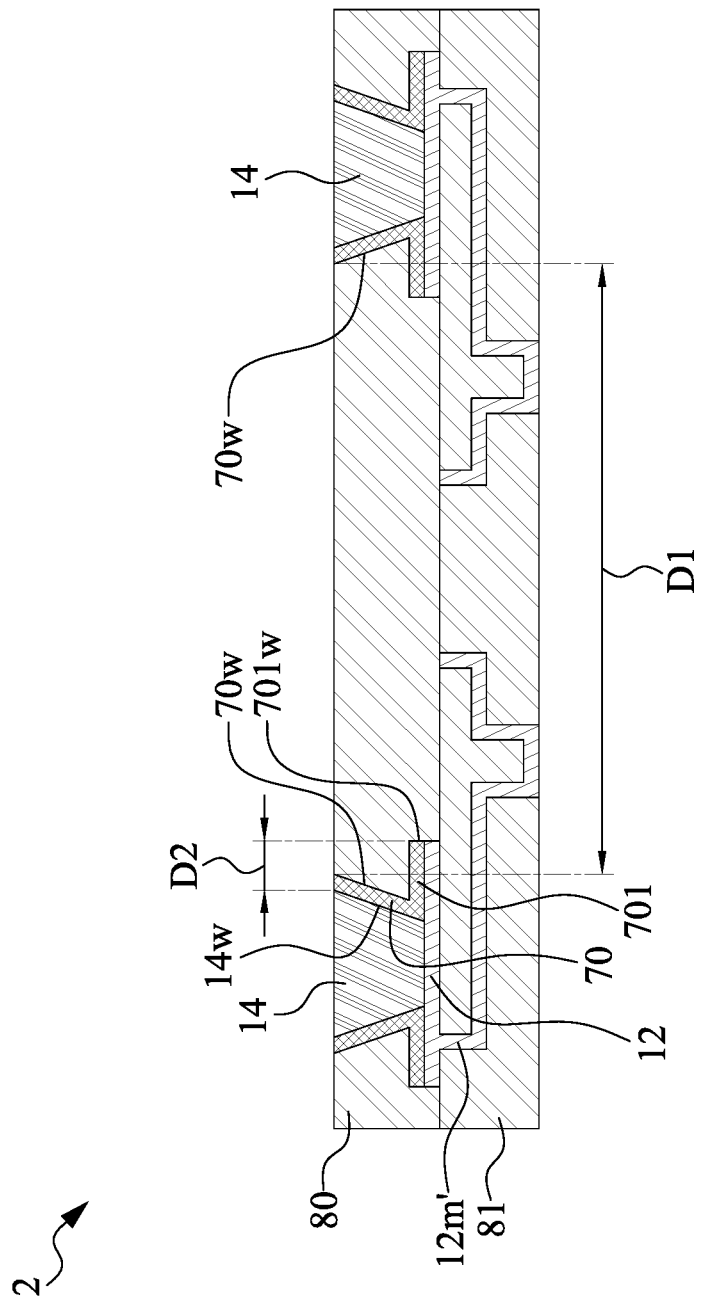
FIG. 2 illustrates a cross-sectional view of a bonding structure according to some embodiments of the present disclosure.

FIG. 2 illustrates a cross-sectional view of a bonding structure 2 according to some embodiments of the present disclosure. The bonding structure 2 is similar to the bonding structure 1A of FIG. 1A, except that the NT-Cu layer 14 is tapered. In some embodiments, the NT-Cu layer 14 is in the form of a via. In the embodiments illustrated in FIG. 2, the pitch of two adjacent NT-Cu layers 14 may be evaluated based on a smallest distance D1 between the outer sidewalls 70w of the barrier layers 70 which surround the two adjacent NT-Cu layers 14 respectively. In some embodiments, the distance D1 may be 6.0 μm or below, 5.5 μm or below, or 5.0 μm or below. In some embodiments, the distance D1 may be in the range of 4.5 μm to 5.5 μm. Further, in the embodiments illustrated in FIG. 2, a smallest distance D2 from a sidewall 14w of the NT-Cu layer 14 to the outer sidewall 701w of the extension portion 701 of the barrier layer 70 may be 0.05 μm or more. In some embodiments, D2 may be in a range of 0.05 μm to 1 μm.

Figure 3:
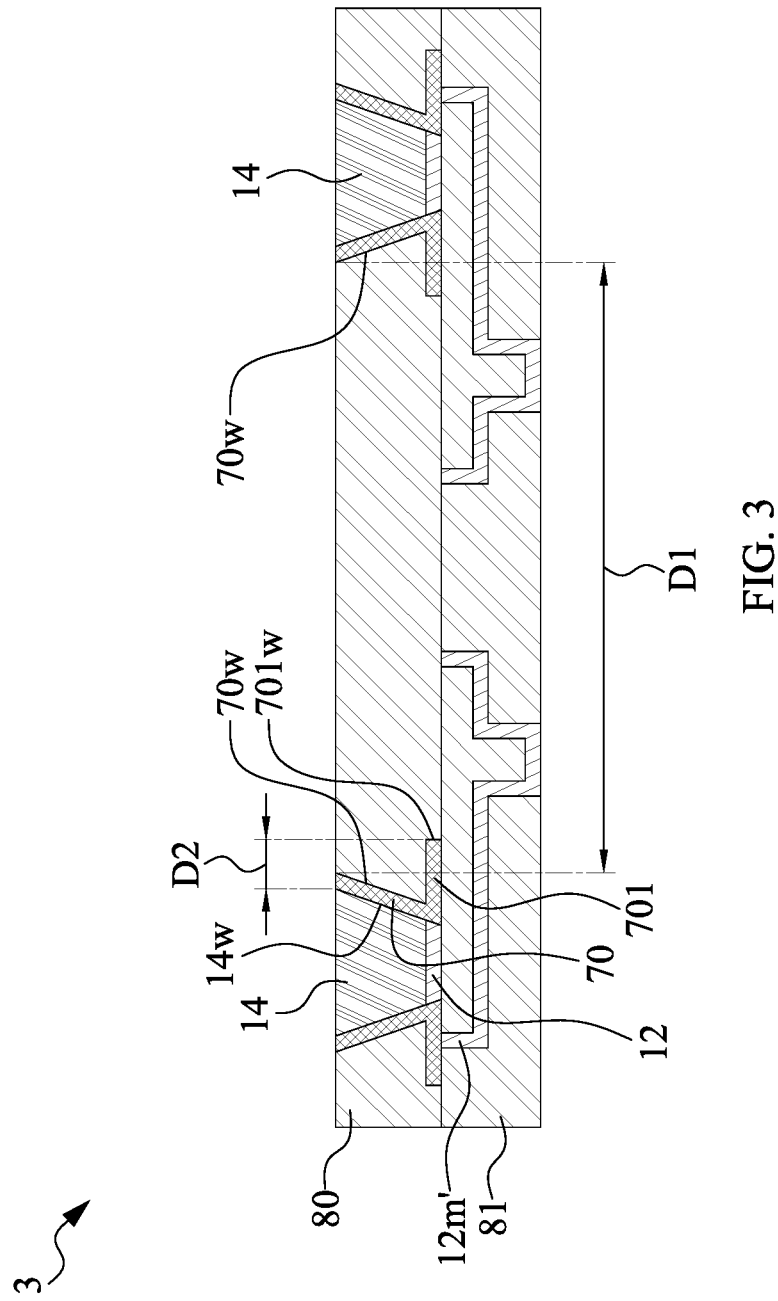
FIG. 3 illustrates a cross-sectional view of a bonding structure according to some embodiments of the present disclosure.

FIG. 3 illustrates a cross-sectional view of a bonding structure 3 according to some embodiments of the present disclosure. The bonding structure 3 is similar to the bonding structure 1B of FIG. 1B, except that the NT-Cu layer 14 is tapered. In some embodiments, the NT-Cu layer 14 is in the form of a via. In the embodiments illustrated in FIG. 3, the pitch of two adjacent NT-Cu layers 14 may be evaluated based on a smallest distance D1 between the outer sidewalls 70w of the barrier layers 70 which surround the two adjacent NT-Cu layers 14 respectively. In some embodiments, the distance D1 may be 6.0 μm or below, 5.5 μm or below, or 5.0 μm or below. In some embodiments, the distance D1 may be in the range of 4.5 μm to 5.5 μm. Further, in the embodiments illustrated in FIG. 3, a smallest distance D2 from a sidewall 14w of the NT-Cu layer 14 to the outer sidewall 701w of the extension portion 701 of the barrier layer 70 may be 0.05 μm or more. In some embodiments, D2 may be in a range of 0.05 μm to 1 μm.

Figure 4:
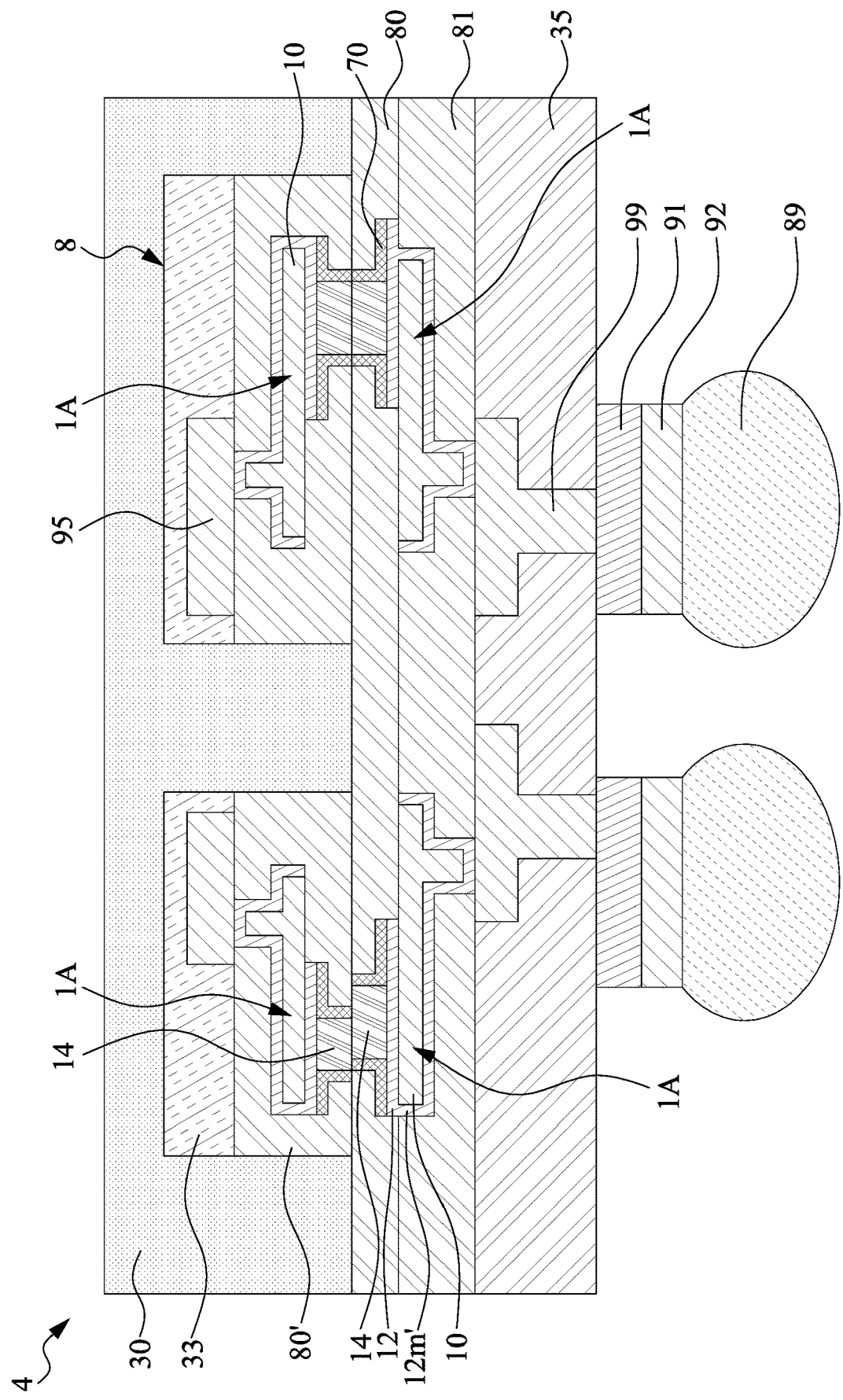
FIG. 4 illustrates a cross-sectional view of a package structure according to some embodiments of the present disclosure.

FIG. 4 illustrates a cross-sectional view of a package structure 4 according to some embodiments of the present disclosure. The package structure 4 includes two semiconductor structures 8 and bonding structures similar to the bonding structure 1A of FIG. 1A. The package structure 4 includes a substrate 35, an interconnection structure 99, a dielectric layer 81, 80 and 80', seed layers 12m', 12 and 91, barrier layers 70, a conductive layer 10, NT-Cu layers 14, encapsulated material 30, conductive pads 92 and solder balls 89.

The dielectric layer 81 is disposed on a top surface of the substrate 35. The conductive layer 10 and the seed layer 12m' are embedded in the dielectric layer 81 and exposed from a top surface of the dielectric layer 81 (in some embodiments, the seed layer 12m' may be viewed as a part of the conductive layer 10). The solder ball 89 is disposed on a bottom surface of the substrate 35. The conductive layer 10 may be electrically connected to the solder ball 89 via the interconnection structure 99 embedded within the substrate 35. In some embodiments, the pad 92 and seed layer 91 may be disposed between the interconnection structure 99 and the solder ball 89. The pad 92 and seed layer 91 may be embedded within the substrate 35 or disposed on a bottom surface of the substrate 35.

A bonding structure 1A is disposed on the conductive layer 10 (in some embodiments, the conductive layer 10 may be viewed as a part of the bonding structure 1A). The bonding structure 1A includes the seed layer 12, the NT-Cu layer 14, the barrier layer 70 and the dielectric layer 80. The details of the bonding structure 1A are as discussed above.

The semiconductor structure 8 may include a substrate 33, a component 95 embedded within or disposed on a bottom surface of the substrate 33, a dielectric layer 80' and a bonding structure 1A. The dielectric layer 80' covers the bottom surface of the substrate 33 and the component 95. The bonding structure 1A is surrounded by a dielectric layer 80' and exposed from a bottom surface of the dielectric layers 80'. In some embodiments, the component 95 may be a conductive layer or an electronic device. The component 95 is electrically connected to the substrate 35 by bonding (e.g., hybrid bonding) the bonding structure 1A of semiconductor structure 8 to the respective bonding structure 1A disposed on the substrate 35. In the embodiments according to the present disclosure, since the bonding structure containing a NT-Cu layer, and therefore, the bonding process can be carried out at a lower temperature as compared to a conventional bonding structure containing a Cu-plating layer other than a NT-Cu layer. Furthermore, in some embodiments, the NT-Cu layers 14 in the two bonding structures 1A are anisotropic (e.g., highly (111)-oriented), so the NT-Cu layers 14 have a more uniform thermal expansion rate at the bonding interface. As a result, the NT-Cu layers 14 can be bonded to each other unfirmly at the bonding interface, and thus less voids are formed during the bonding interface, and superior adhesion strength and electrical connection can be achieved.

As shown in FIG. 4, the bonding structure 1A of semiconductor structure 8 may be substantially aligned with the respective bonding structure 1A disposed on the substrate 35; in some embodiments, slight misalignment may occur and are acceptable.

The material for making the substrates 33 and 35 may be the same or different. In some embodiments, the substrate 33 or the substrate 35 includes, for example, glass, silicon, silicon dioxide ($SiO_2$), or a combination thereof.

In some embodiments, the material for making interconnection structure 99, conductive layers 10 and conductive pads 92 may be the same or different and can be selected from those for making the conductive layer 10 as disclosed above. In some embodiments, the material for making the seed layers 12, 12m and 91 may be the same or different and can be selected from those for making the seed layer 12 as disclosed above. In some embodiments, the material for making the dielectric layers 81, 80 and 80' may be the same or different and can be selected from those disclosed above for making the dielectric layer 80.

Figure 5A:
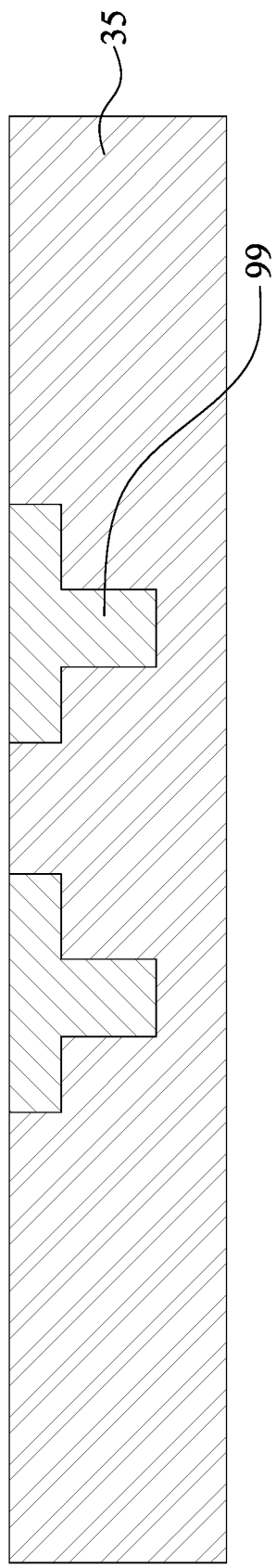
FIGS. 5A-5Q illustrate some embodiments of a method of manufacturing the package structure depicted in FIG. 4.
Figure 5B:
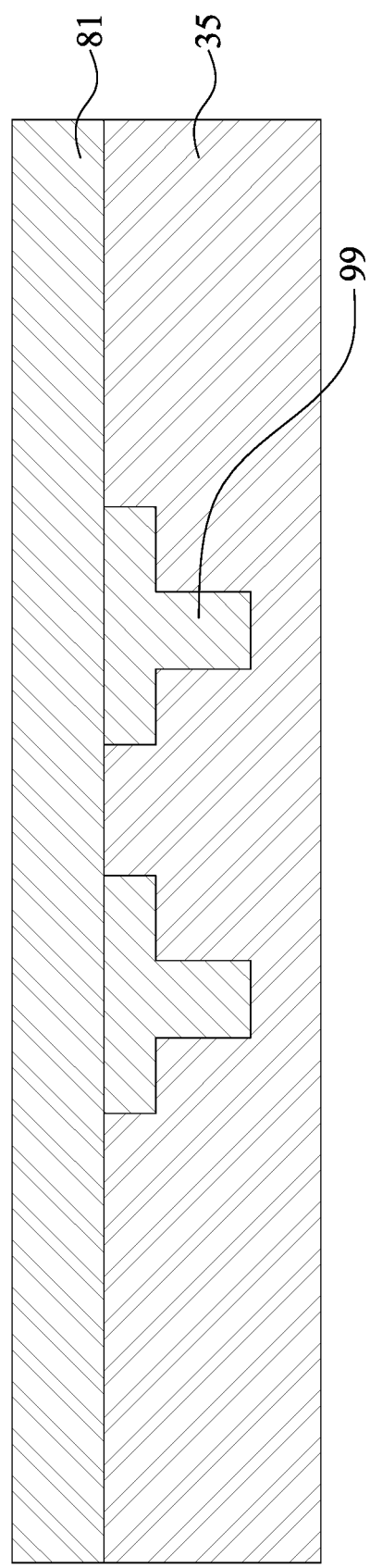
Figure 5C:
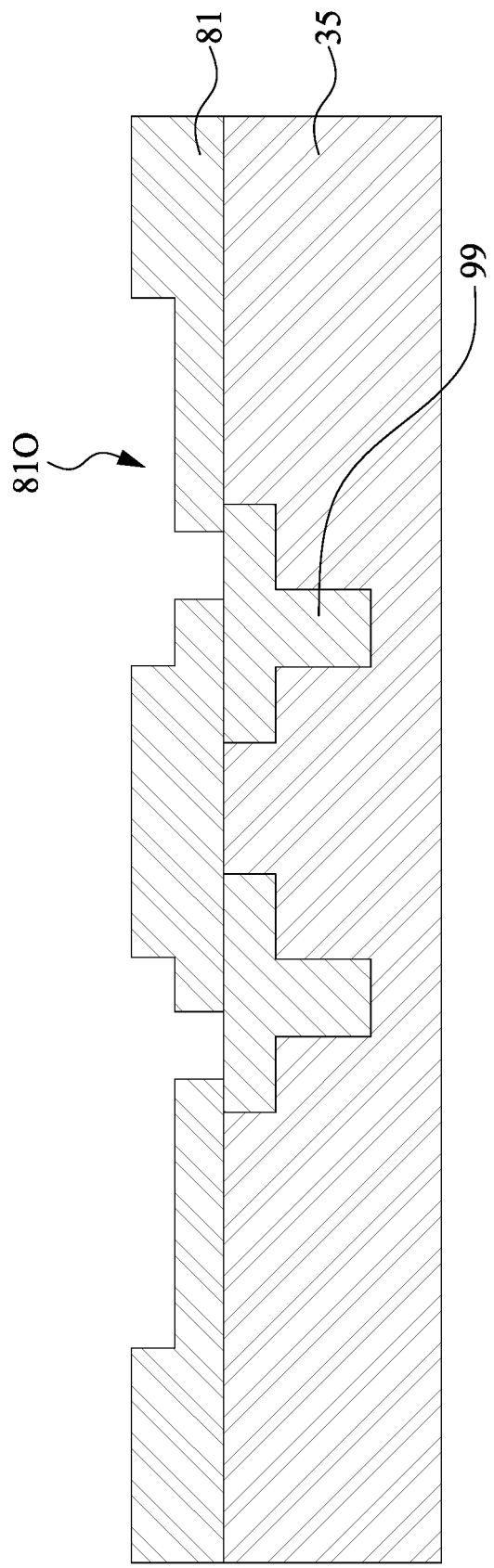
Figure 5D:
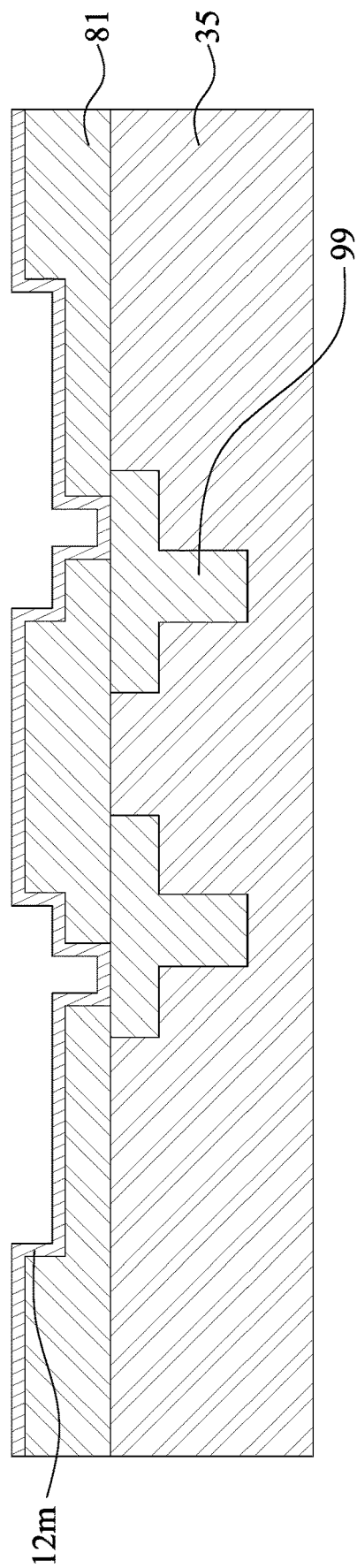
Figure 5E:
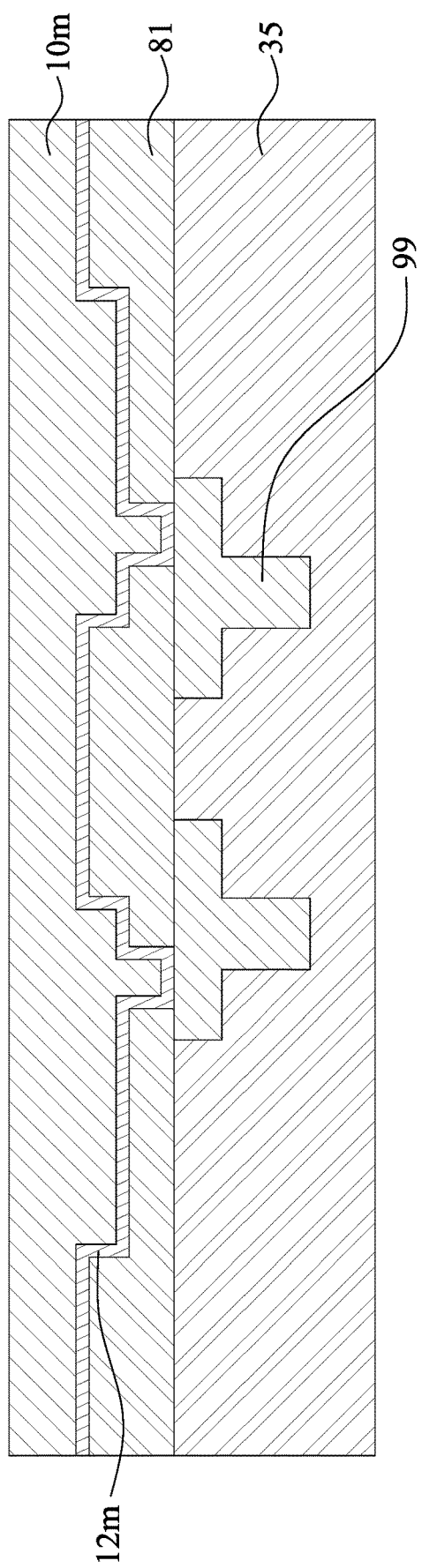
Figure 5F:
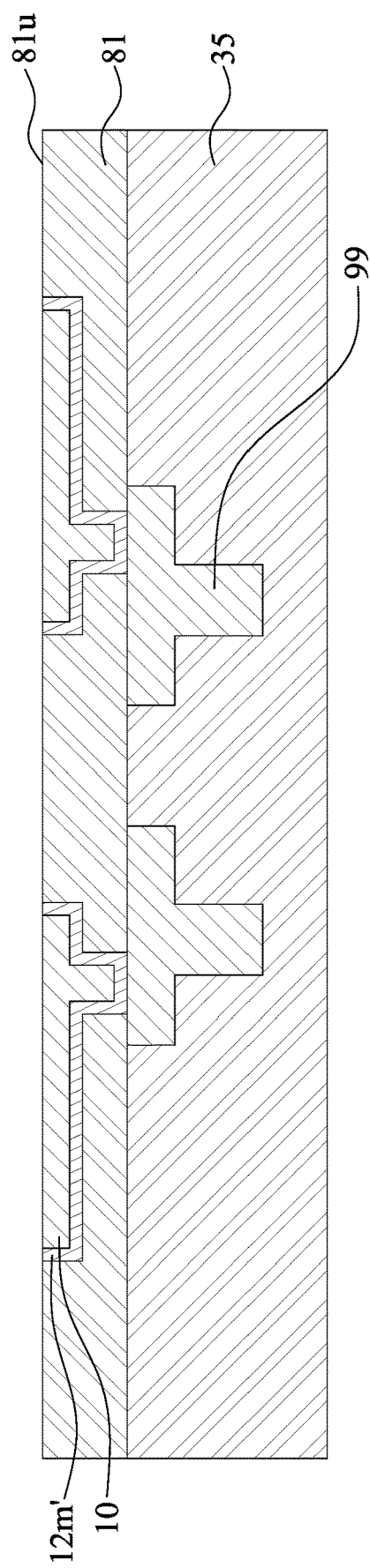
Figure 5G:
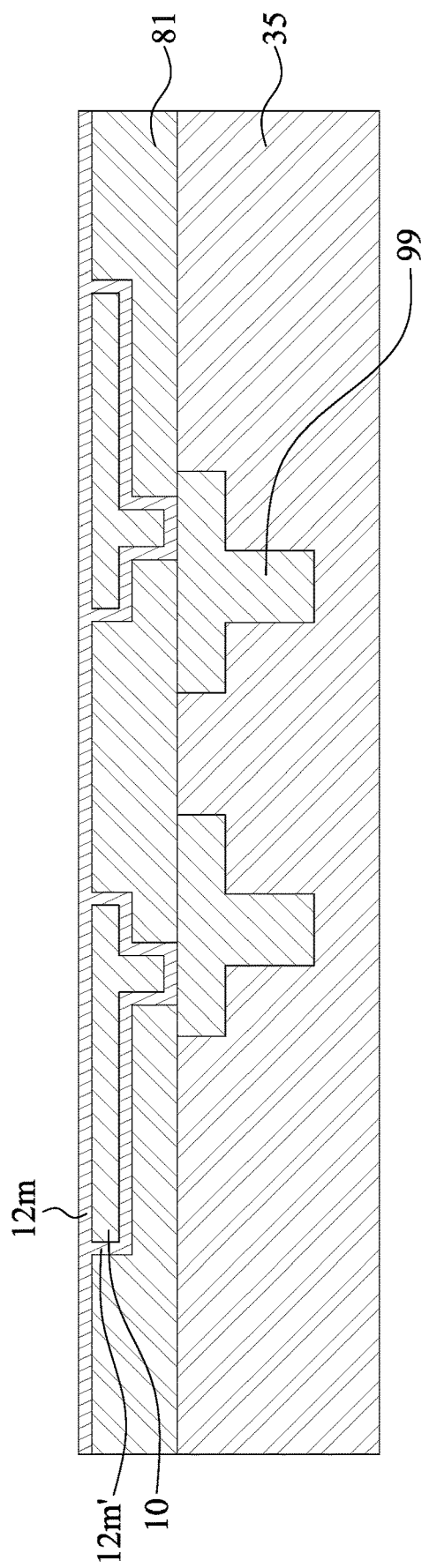
Figure 5H:
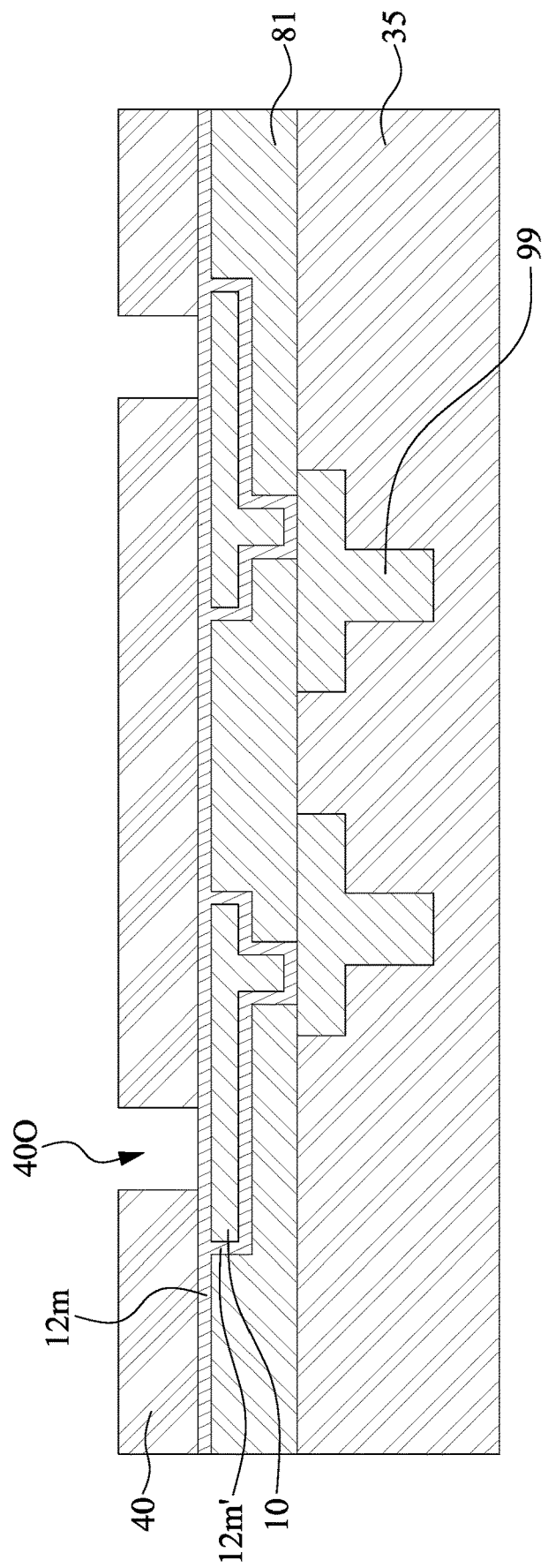
Figure 5I:
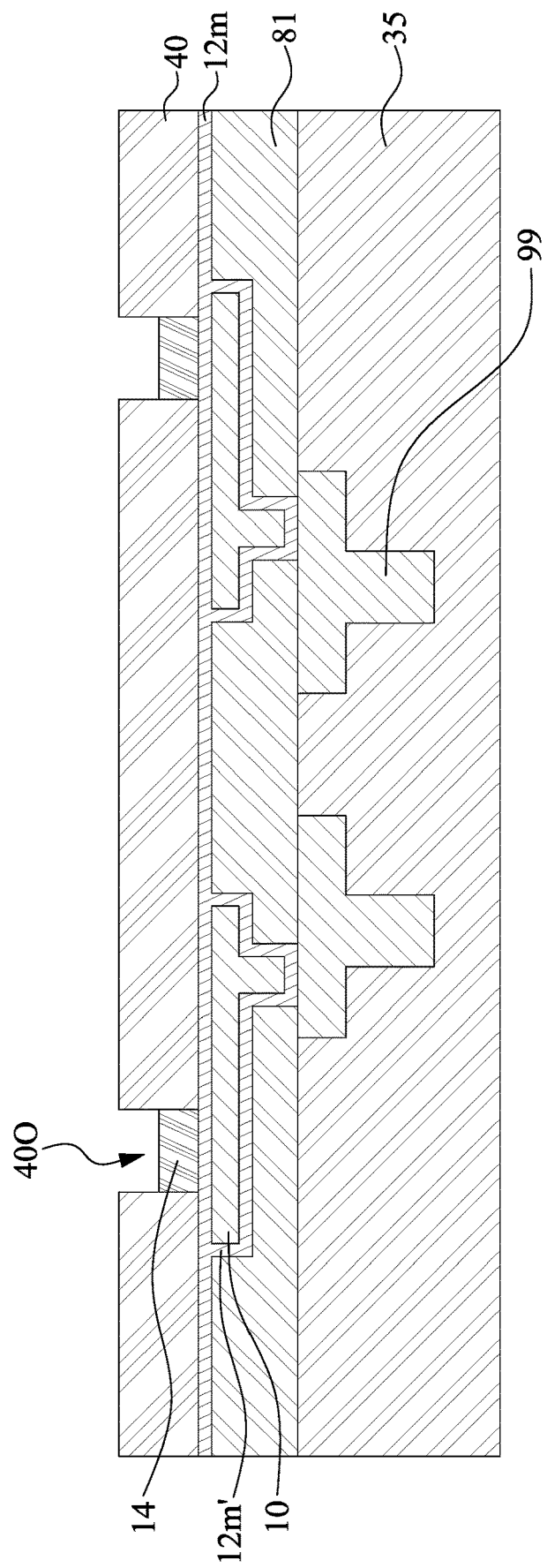
Figure 5J:
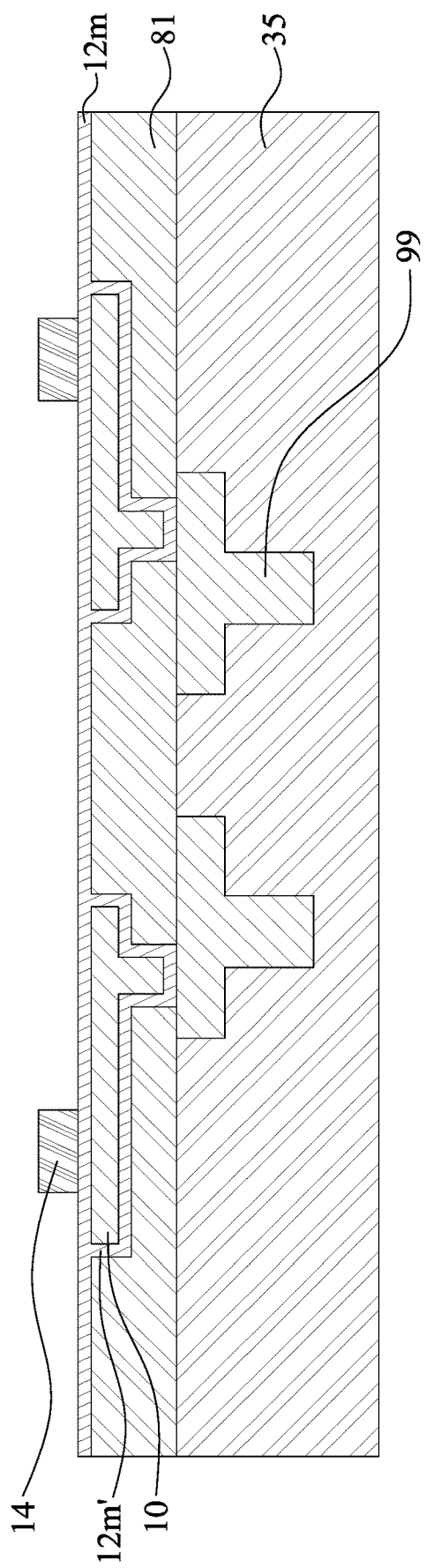
Figure 5K:
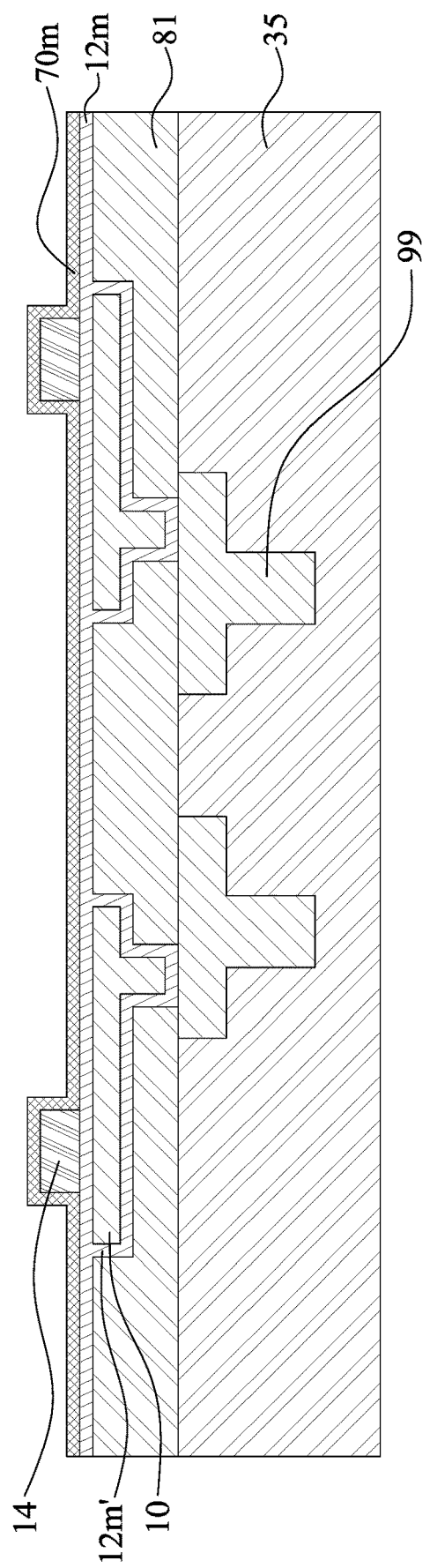
Figure 5L:
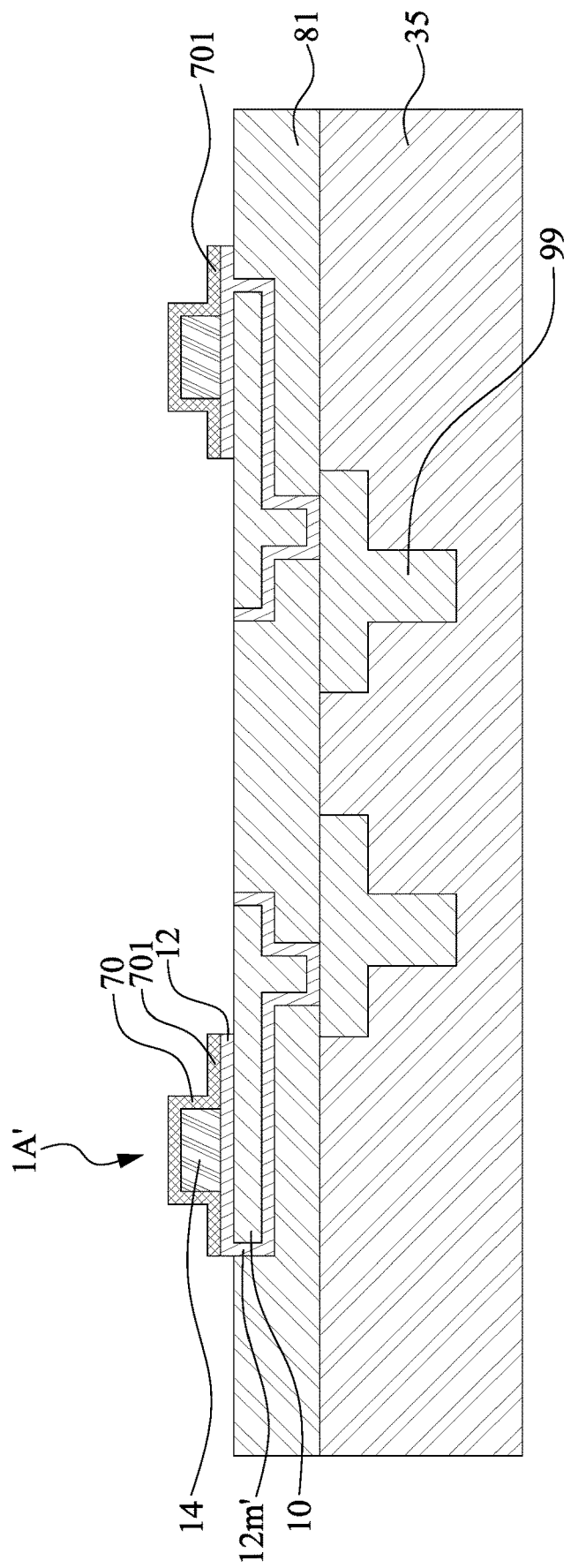
Figure 5M:
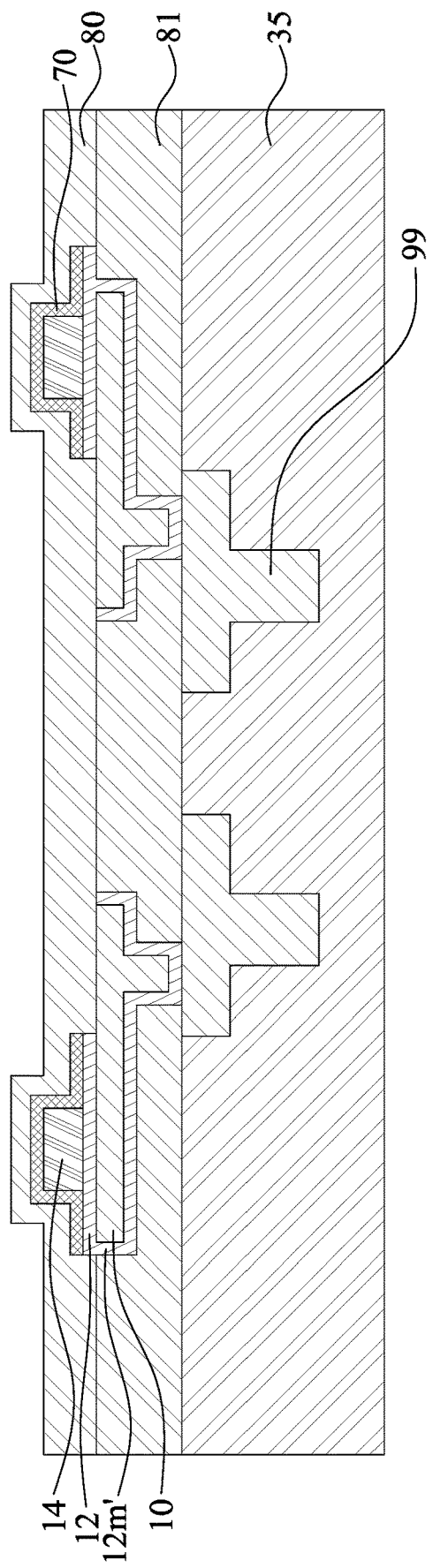
Figure 5N:
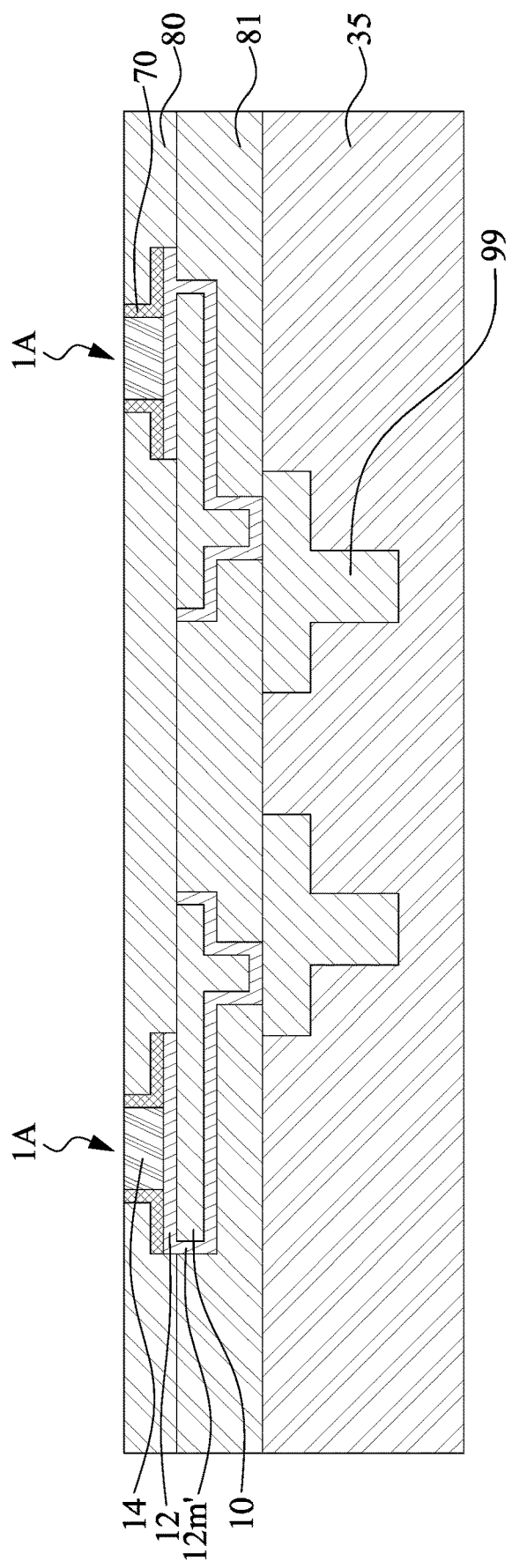
Figure 5O:
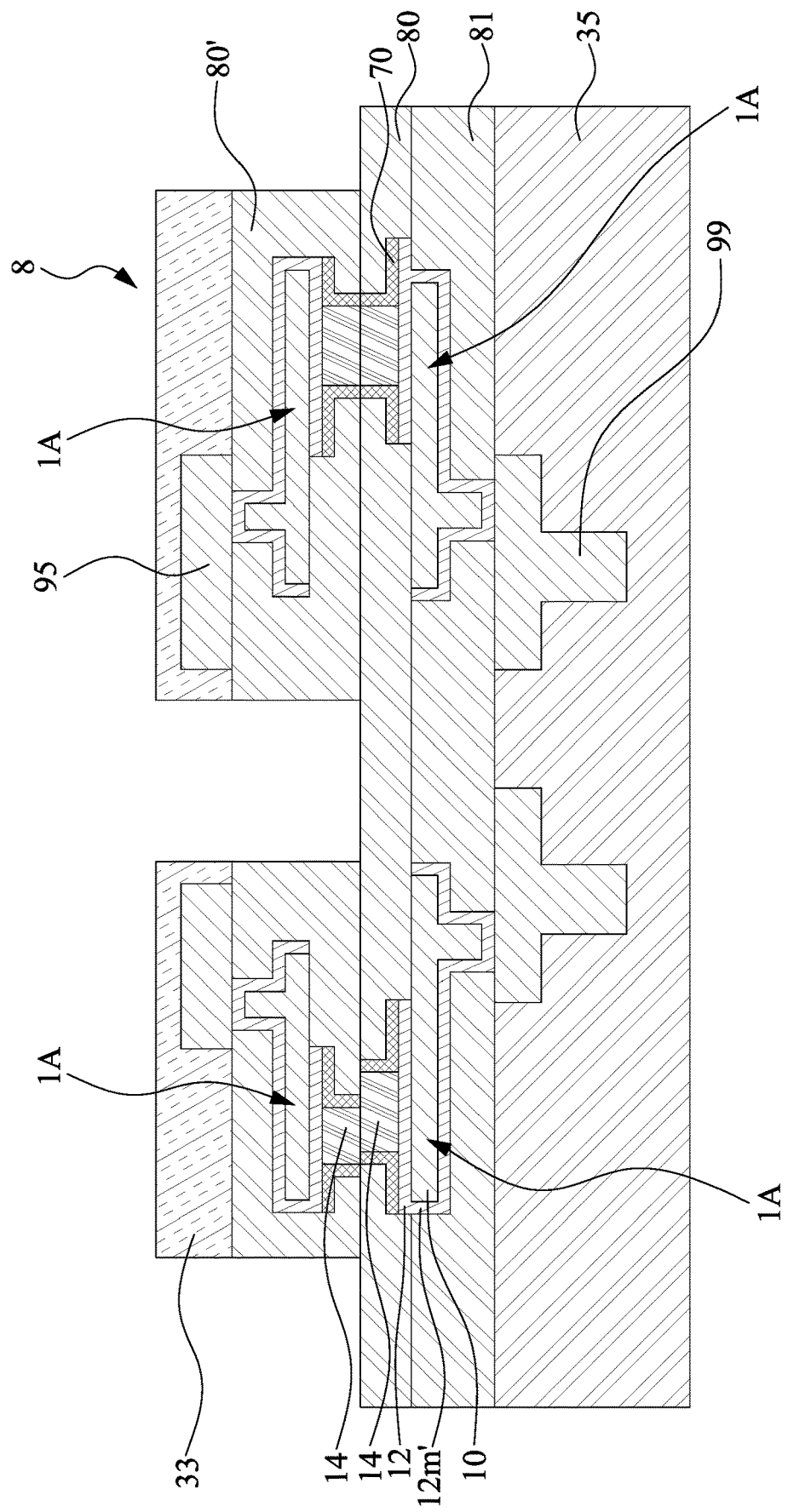
Figure 5P:
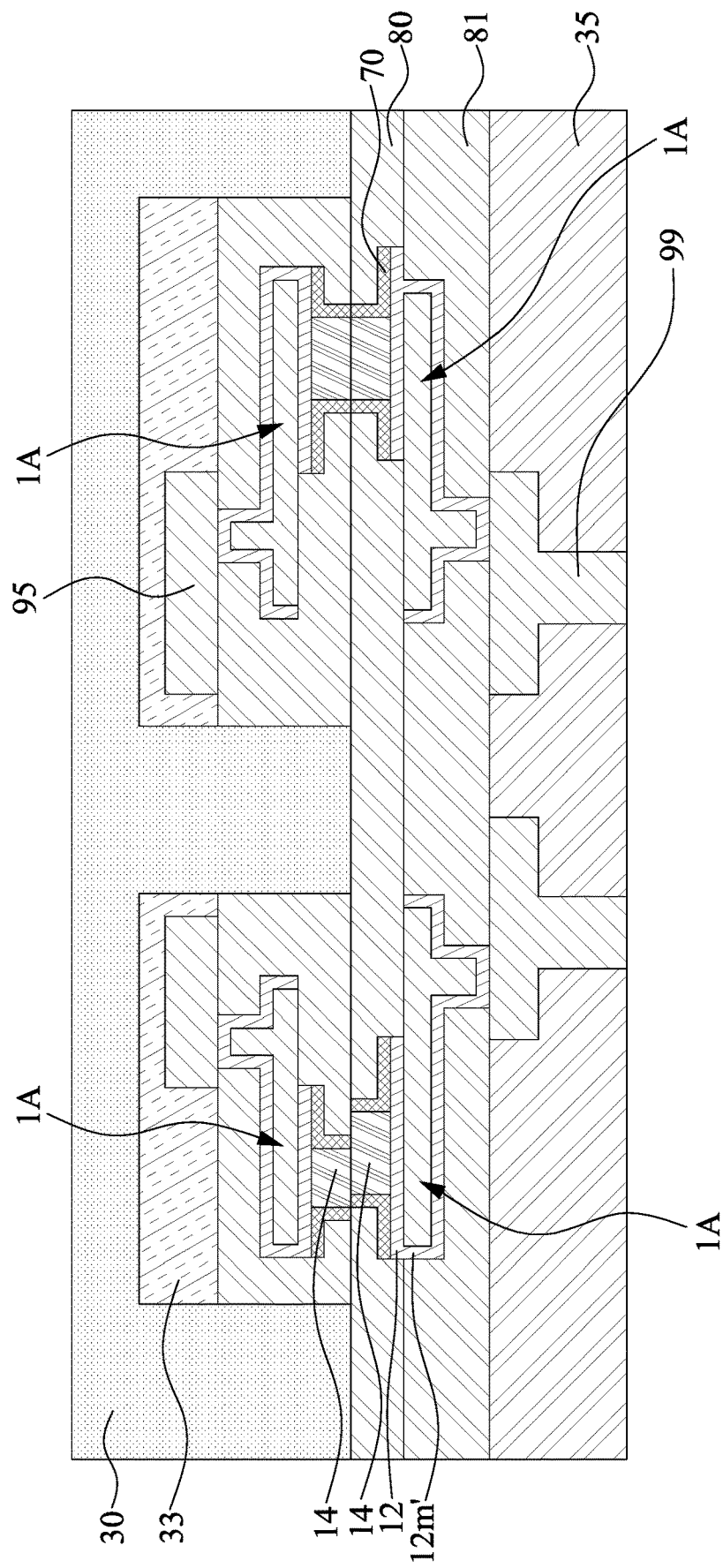
Figure 5Q:
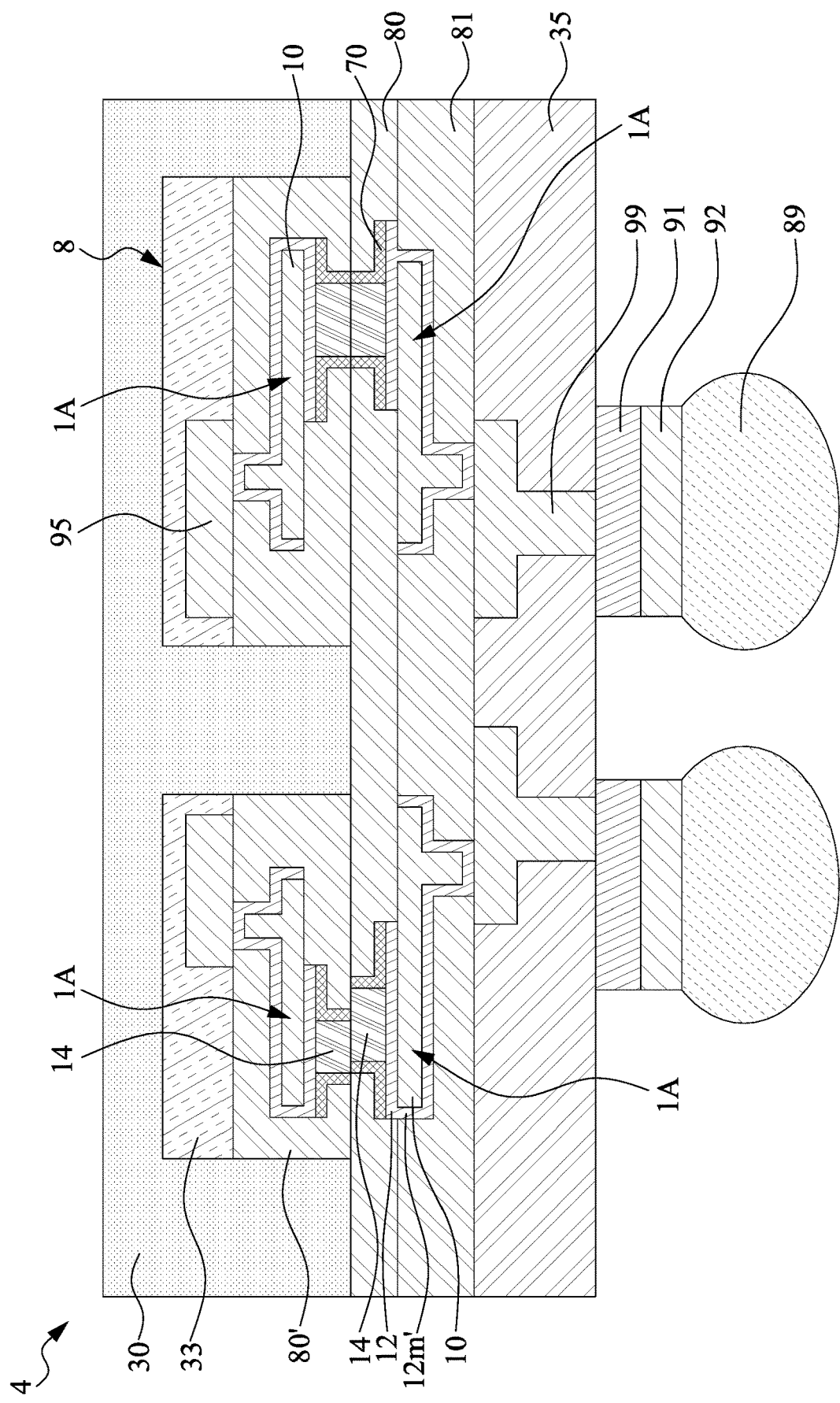

FIGS. 5A-5Q illustrate some embodiments of a method of manufacturing the package structure 4 depicted in FIG. 4.

Referring to FIG. 5A, a substrate 35 is provided. An interconnection structure 99 is formed in the substrate 35. In some embodiments, the interconnection structure 99 may include, for example, copper (Cu), or other metal, or a metal alloy, or other conductive material.

Referring to FIG. 5B, a dielectric layer 81 is formed on the substrate 35. In some embodiments, the dielectric layer 81 is made of oxides (e.g., $SiO_x$), nitrides (e.g., $SiN_x$), polymeric materials, or other suitable materials.

Referring to FIG. 5C, the dielectric layer 81 is patterned, e.g., by a photolithography process, to form one or more openings 81O. The photolithography may be carried out one or more times. The openings 81O have a shape corresponding to a conductive layer 10 to be formed in subsequent stages.

FIG. 5D, FIG. 5E and FIG. 5F illustrate the formation of the conductive layer 10.

Referring to FIG. 5D, a seed layer 12m is conformally formed on the dielectric layer 81 and in the openings 81O, e.g., by sputtering. Referring to FIG. 5E, a conductive layer 10m (e.g., a cupper layer) is formed on the seed layer 12m, e.g., by plating. Referring to FIG. 5F, a portion of the conductive layer 10m and seed layer 12m is removed, e.g., by a chemical mechanical planarization process (CMP) to expose a top surface 81u of the dielectric layer 81 and form the seed layer 12m' and the conductive layer 10. The seed layer 12m' and the conductive layer 10 have a shape defined by the openings 81O of the dielectric layer 81 (in some embodiments, the seed layer 12m' can be viewed as a part of the conductive layer 10). As shown in FIG. 5F, the conductive layer 10 may include vias connecting to the interconnection structure 99 of the substrate 35 and conductive pads or traces exposed from the top surface 81u of the dielectric layer 81.

Referring to FIG. 5G, another seed layer 12m is formed on the conductive layer 10 and the dielectric layer 81.

Referring to FIG. 5H, a patterned photoresist 40 is formed on the seed layer 12m. The photoresist layer 40 defines opening(s) 40O. A portion of the seed layer 12m is exposed from the photoresist layer 40.

Referring to FIG. 5I, a NT-Cu layer 14 is formed in the openings 40O and on the seed layer 12m exposed from the openings 40O. The NT-Cu layer 14 may be formed, e.g., by plating or other suitable processes. Since the NT-Cu layer 14 is formed on a planar seed layer 12m (i.e., no seed layer is disposed on a sidewall of the openings 40O), the crystal structure of the NT-Cu layer 14 can grow without being interfered by the sidewall seed layer. Therefore, the resulting NT-Cu layer 14 has anisotropic crystal structure (e.g., highly (111)-oriented). The NT-Cu layer 14 has a shape defined by the opening 40O. Though not shown in FIG. 5I, in some embodiments, the NT-Cu layer 14 may be tapered when the opening 40O is tapered.

Referring to FIG. 5J, the positive photoresist 40 is removed.

Referring to FIG. 5K, a barrier material 70m is formed on the conductive layer 12m and the NT-Cu layer 14, e.g., by sputtering and/or plating. The barrier material 70m is made of metal, alloy, metal nitrides, metal silicon nitrides, or other suitable material. In some embodiments, the barrier layer 70m may include titanium (Ti), tantalum (Ta), tungsten (W), nickel (Ni), titanium nitride (TiN), tantalum nitride (TaN), tungsten nitride (WN), titanium silicon nitrides (TiSiN), tantalum silicon nitrides (TaSiN), or tungsten silicon nitrides (WSiN).

Referring to FIG. 5L, the barrier material 70m and the seed layer 12m underlying the barrier layer 70m are patterned, e.g., by a photolithography process and a bonding structure 1A' is formed. The bonding structure 1A' includes a seed layer 12, a NT-Cu layer 14 on the seed layer 12, and a barrier layer 70 surrounding a sidewall of the NT-Cu layer 14 and covering a top surface of the NT-Cu layer 14.

Although as illustrated in FIG. 5L, the barrier layer 70 has an extension 701, the barrier layer 70 may be formed without an extension 701.

Referring to FIG. 5M, a dielectric layer 80 is formed on the barrier layer 70 and dielectric layer 81. In some embodiments, the dielectric layer 80 is made of oxides (e.g., SiO$_x$), nitrides (e.g., SiN$_x$), polymeric materials, or other suitable materials.

Referring to FIG. 5N, a portion of the dielectric layer 80 is removed to expose a top surface of the barrier layer 70 and a top surface of the NT-Cu layer 14. A bonding structure 1A is formed. The bonding structure 1A includes a seed layer 12, a NT-Cu layer 14 on the seed layer 12, a barrier layer 70 surrounding a sidewall of the NT-Cu layer 14 and exposing a top surface of the NT-Cu layer 14. The bonding structure 1A includes a dielectric layer 80 and the barrier layer 70 is located between the dielectric layer 80 and the NT-Cu layer 14.

Referring to FIG. 5O, a semiconductor structure 8 is provided. The semiconductor structure 8 includes a substrate 33, a component 95 embedded within or disposed on a bottom surface of the substrate 33, a dielectric layer 80' and a bonding structure 1A. The bonding structure 1A of semiconductor structure 8 is substantially aligned with a respective bonding structure 1A disposed on the substrate 35 and then a hybrid bonding process is carried out so that the NT-Cu layers 14 in the two bonding structures 1A are bonded to each other.

Referring to FIG. 5P, an encapsulated material 30 is formed to encapsulate the semiconductor structure 8. A portion of the substrate 35 is removed, e.g., by CMP to expose the interconnection structure 99.

Referring to FIG. 5Q, a seed layer 91 and conductive pad 92 are formed to contact the interconnection structure 99. A solder ball 89 is formed to contact the seed layer 91 and conductive pad 92. A semiconductor structure 4 is obtained.

Figure 6:
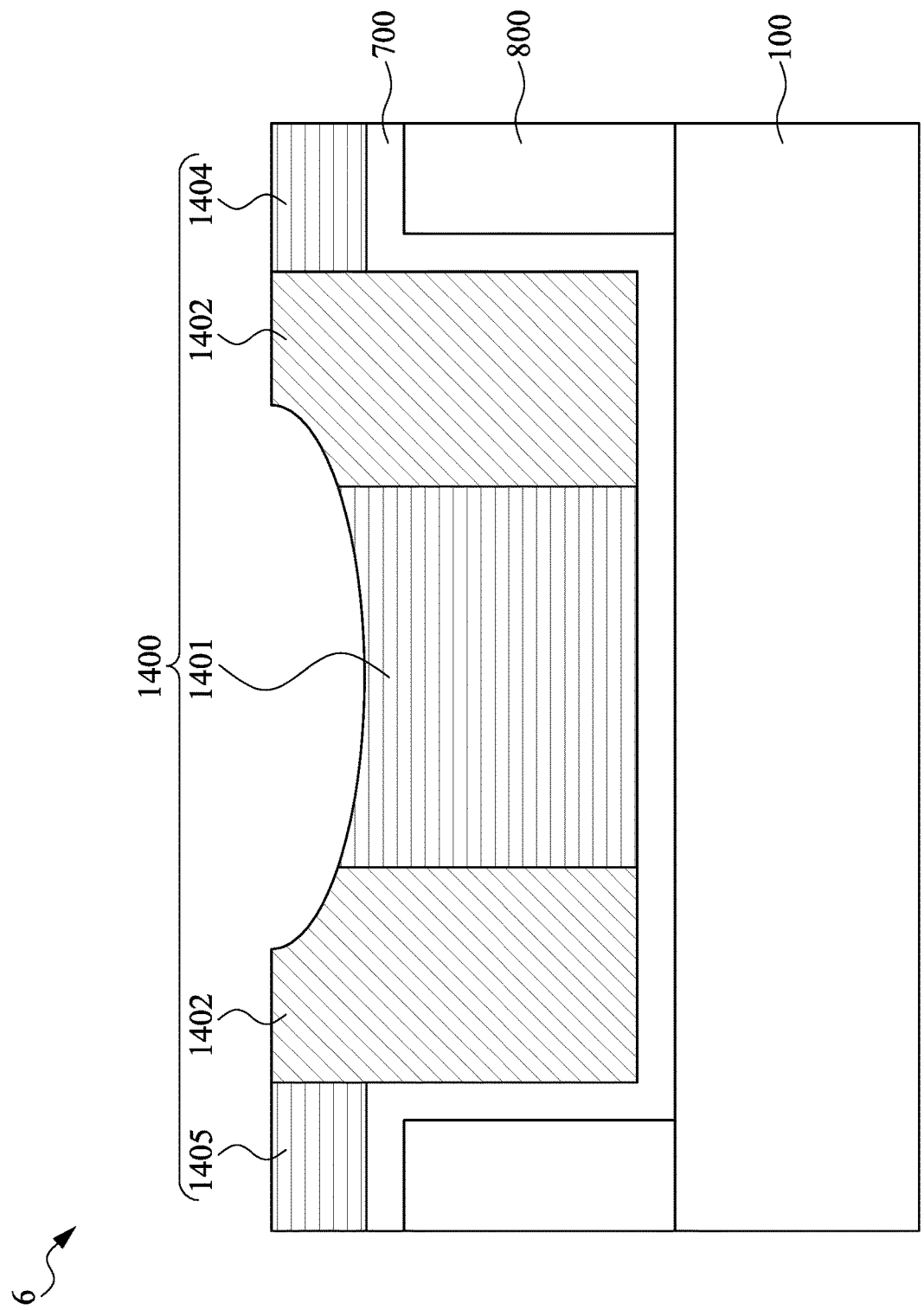
FIG. 6 illustrates a cross-sectional view of a bonding structure according to a comparative embodiment of the present disclosure.

FIG. 6 illustrates a cross-sectional view of a bonding structure 6 according to a comparative embodiment of the present disclosure. The bonding structure 6 includes a conductive layer 100, a dielectric layer 800 (e.g., SiOx), a seed layer 700 and a NT-Cu layer 1400. As shown in FIG. 6, the dielectric layer 800 has a recess and the seed layer 700 is formed in a sidewall and a bottom surface of the recess and the NT-Cu layer 1400 is formed on the seed layer 700. However, since the NT-Cu layer 1400 is not formed on a planar seed layer, the growth of the crystal structure of the NT-Cu layer 1400 is interfered by the seed layer formed on the sidewall of the recess. The resulting NT-Cu layer 1400 has an isotropic crystal structure and includes both of (111) crystallographic plane (e.g., 1401, 1404, 1405) and non-(111) crystallographic plane (e.g., 1402). The (111) crystallographic plane 1401 at the center of the NT-Cu layer 1400 is surrounded by non-(111) crystallographic plane (e.g., 1402). In such embodiments, different bonding speeds can be observed at the center of the NT-Cu layer 1400 and the periphery of the NT-Cu layer 1400 since the (111) plane at the center and the non-(111) plane at the periphery results in different thermal expansion rates, and therefore, when carrying out hybrid bonding of two NT-Cu layers, voids may be generated and retained at the bonding interface and thus good electrical connection cannot be achieved. In addition, it is also found that Cu may diffuse through the dielectric layer which causes serious reliability issues.

The present disclosure provides a new bonding structure. As compared to the embodiments illustrated in FIG. 6, the bonding structure of the present disclosure includes a NT-Cu layer having anisotropic crystal structure (e.g., highly (111)-oriented) which allows a more uniform thermal expansion at a top surface of the NT-Cu layer, and therefore, superior bonding strength and electrical connection between two NT-Cu layers that are bonded to each other can be achieved. In some embodiment, a barrier layer is provided and surrounds the NT-Cu layer; the barrier layer can prevent Cu diffusion and consequent element failure. In some embodiments, the barrier layer may include a protrusion and thus the adhesion of the NT-Cu layer with the dielectric layer can be improved.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of the embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A bonding structure, comprising:
   a conductive layer;
   a seed layer disposed on the conductive layer; and
   a nanotwinned copper (NT-Cu) layer disposed on the seed layer, wherein the NT-Cu layer has anisotropic crystal structure, wherein the NT-Cu layer has a top surface exposed from a dielectric layer.

2. The bonding structure according to claim 1, wherein a lateral width of the NT-Cu layer is less than or substantially the same as a lateral width of the seed layer.

3. The bonding structure according to claim 1, further comprising a barrier layer surrounding the NT-Cu layer.

4. The bonding structure according to claim 3, wherein the barrier layer includes an extension portion protruding from an outer sidewall of the barrier layer.

5. The bonding structure according to claim 4, wherein the extension portion of the barrier layer has a sidewall substantially coplanar with a sidewall of the seed layer.

6. The bonding structure according to claim 3, wherein the barrier layer directly contacts the NT-Cu layer.

7. The bonding structure according to claim 1, wherein the NT-Cu layer is tapered.

8. The bonding structure according to claim 3, wherein the top surface of the NT-Cu layer is exposed from the barrier layer.

9. A bonding structure, comprising:
   a seed layer;
   an anisotropic NT-Cu layer disposed on the seed layer, wherein the NT-Cu layer is highly (111) oriented;
   a dielectric layer surrounding the anisotropic NT-Cu layer; and
   a barrier layer disposed between the dielectric layer and the anisotropic NT-Cu layer, wherein the barrier layer includes an extension portion protruding from an outer sidewall of the barrier layer.

10. The bonding structure according to claim 9, wherein a bottom surface of the extension portion of the barrier layer contacts the seed layer.

11. The bonding structure according to claim 9, wherein a bottom surface of the extension portion of the barrier layer contacts the conductive layer.

12. A bonding structure, comprising:
    a seed layer;
    an anisotropic NT-Cu layer disposed on the seed layer;
    a dielectric layer surrounding the anisotropic NT-Cu layer; and
    a barrier layer disposed between the dielectric layer and the anisotropic NT-Cu layer, wherein the NT-Cu layer is tapered.

13. A method for manufacturing a bonding structure, comprising:
    providing a seed layer;
    forming a NT-Cu layer on the seed layer; and
    forming a barrier layer surrounding the NT-Cu layer, wherein forming a NT-Cu layer on the seed layer comprises:
    providing a photoresist layer on the seed layer, wherein the photoresist layer defines an opening exposing the seed layer; and
    forming the NT-Cu layer on the seed layer exposed from the opening.

14. The method according to claim 13, further comprising removing the photoresist layer and a portion of the seed layer underlying the photoresist layer before forming the barrier layer.

15. The method according to claim 13, further comprising removing a portion of the barrier layer and a portion of the seed layer underlying the barrier layer.

16. A method for manufacturing a bonding structure, comprising:
    providing a seed layer;
    forming a NT-Cu layer on the seed layer; and
    forming a barrier layer surrounding the NT-Cu layer, wherein the NT-Cu layer is tapered.

* * * * *